US008717098B2

(12) United States Patent
Cawley

(10) Patent No.: US 8,717,098 B2
(45) Date of Patent: May 6, 2014

(54) HIGH GAIN, HIGH VOLTAGE POWER AMPLIFIER

(75) Inventor: Kevin G. Cawley, Sagamore Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 13/547,816

(22) Filed: Jul. 12, 2012

(65) Prior Publication Data

US 2013/0265110 A1 Oct. 10, 2013

Related U.S. Application Data

(60) Provisional application No. 61/621,784, filed on Apr. 9, 2012.

(51) Int. Cl.
*H03F 17/00* (2006.01)

(52) U.S. Cl.
USPC .......... 330/59

(58) Field of Classification Search
USPC .......... 330/59, 292, 308
See application file for complete search history.

(56) References Cited

U.S. PATENT DOCUMENTS

| | | | | |
|---|---|---|---|---|
| 4,032,843 | A * | 6/1977 | Loucks | 324/96 |
| 5,939,944 | A * | 8/1999 | Gibson | 330/255 |
| 6,563,377 | B2 * | 5/2003 | Butler | 330/10 |

* cited by examiner

*Primary Examiner* — Steven J Mottola

(74) *Attorney, Agent, or Firm* — Daniel S. Goldberg; Thomas F. Lenihan; Marger Johnson & McCollom, PC

(57) ABSTRACT

An opto-isolated amplifier and method are disclosed. The amplifier includes an input node configured to receive an input to be amplified. A pair of opto-isolators are coupled between an input node and an output node. The opto-isolators are configured to create gain between the input node and the output node. An amplification stage is coupled to the opto-isolators. The amplification stage includes an input coupled to the output node and an output configured to generate an amplified output. The opto-isolator outputs may be configured to generate a difference current. The input of the amplification stage may have a high impedance compared to an impedance at the output node, the difference current being directed at the high input impedance input of the amplification stage to generate a gained voltage.

22 Claims, 9 Drawing Sheets

Figure 6
REF LEVEL
/DIV
MARKER 77 490.478Hz
0.000dB
10.000dB
MAG(A/R) 0.979dB
0.0deg
45.000deg
MARKER 77 490.478Hz
PHASE(A/R) -95.279deg
100
1K
10K
100K
1M
10M
START 100.000Hz
STOP 10 000 000.000Hz

HIGH GAIN, HIGH VOLTAGE POWER AMPLIFIER

CROSS-REFERENCE TO PRIOR FILED APPLICATIONS

This application claims priority to earlier filed U.S. provisional application No. 61/621,784, filed Apr. 9, 2012, which is incorporated herein in its entirety.

FIELD OF INVENTION

This invention relates generally to power amplifiers and, more particularly, to power amplifiers capable of high gain and high voltage output from low voltage input.

BACKGROUND

Source measure units (SMU) are used to make precision measurements in many fields, including the testing of semiconductor products. Source measure units force either a voltage or a current and then respectively measure a resulting current or voltage. Existing high voltage amplifier circuits incorporated into an SMU typically use voltage translation circuits to achieve gain from low voltage inputs to high voltage outputs. Existing techniques also make it very difficult to achieve multiple power envelopes as is typically required of a source measurement unit. For example, consider an SMU with 200V, 100 mA and 20V, 1 A. It would be desirable to provide improved amplifier designs that allows for large gain and multiple power envelopes.

SUMMARY OF THE INVENTION

An opto-isolated amplifier and method are disclosed. The amplifier includes an input node configured to receive an input to be amplified. A pair of opto-isolators are coupled between an input node and an output node. The opto-isolators are configured to create gain between the input node and the output node. An amplification stage is coupled to the opto-isolators. The amplification stage includes an input coupled to the output node and an output configured to generate an amplified output.

The opto-isolated amplifier may also include an input amplifier configured to receive the input to be amplified and having an output coupled to the input node. Each opto-isolator may have an input diode which conducts an input diode current based on the input voltage. The input diodes may be configured in a series configuration joined at the input node, wherein the input voltage sets a difference current between the two input diodes. Each opto-isolator may have an output configured as a current source and having a current that is a gained value based on the corresponding input diode current. The input diodes may be coupled to the input node via current setting resistors.

The opto-isolator outputs may be configured to generate a difference current that is directed into the input of the amplification stage. The amplification stage may be a unity gain amplifier. The amplification stage may include a class A/B amplifier. The input of the amplification stage may have a high impedance compared to an impedance at the output node.

The opto-isolator outputs may be configured to generate a difference current. The input of the amplification stage may have a high impedance compared to an impedance at the output node, the difference current being directed at the high input impedance input of the amplification stage to generate a gained voltage. A feed forward capacitor may be coupled between the input node and the output node.

DETAILED DESCRIPTION OF THE INVENTION

Disclosed herein is an apparatus and method that provides high gain amplification with isolation from input to output. This enables much larger signal voltages on the output than typical input circuit components can withstand. The apparatus and methods disclosed herein allows a low voltage circuit signal be amplified to a high voltage, e.g., 300V/V, opto-electronically, without the need of a complicated intermediate signal translation circuit. Such circuitry is useful in products like the Keithley 2600 family where all control signals are low voltage and are referenced to ground and where it is necessary to produce higher voltages.

Prior designs achieve this goal with topologies that include a string of intermediate transistors to translate the low voltage signals to high voltage. This is done on the Keithley model 2612 where there is a 200V output stage. This type of design costs additional parts and increased power dissipation to power this intermediate stage.

A goal was to design a power amplifier that was capable of high gain and high voltage output from low voltage input. The amplifier also needs to be capable of multiple power envelopes. In one specific case, +/−1500V at 120 mA and +/−3000V at 20 mA. The input signal is limited to +/−15V. To achieve the large voltage gain with a minimum number of parts, it was decided to create the gain across an opto-isolated barrier.

Figure 1:
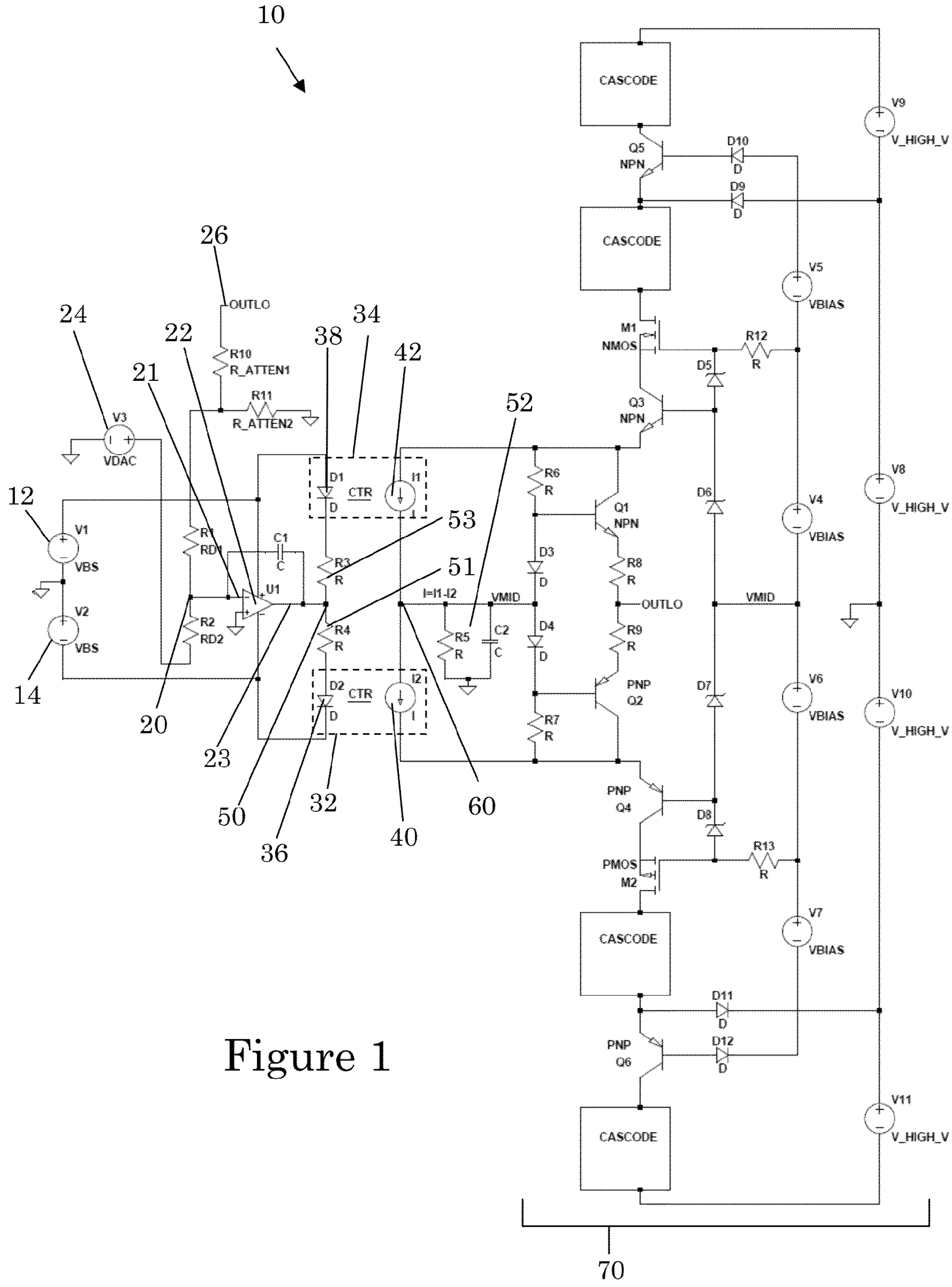
FIG. 1 is a block diagram of a dual opto-isolator amplifier.

FIG. 1 is a block diagram of a dual opto-isolator amplifier 10. Input node 20 is generally coupled to input 21 of op-amp 22. The output 23 of op-amp 22 is coupled to opto-isolator input node 50. In this example, opto-isolators 32, 34 are modeled as input diodes 36, 38 and current source outputs 40, 42. The current source output value is a gained value of the diode current. The opto-isolators 32, 34 are connected in series. The junction of the two diodes 36, 38 through resistors 51, 53 is the input node 50 and the junction of the two current sources is the output node 60.

Each input diode 36, 38 is coupled to a power supply voltage 12, 14. Each input diode 36, 38 also has an associated series resistor 51, 53 configured to set the current through the input diode. In this example, series resistors 51 and 53 have essentially the same resistance value. It should be understood that the specific resistance value is selected based on the desired current range though input diodes 36, 38.

The voltage at input node 50 sets the current in each input diode 36, 38. When the input node is a zero volts, the current is equal in both input diodes 36, 38. When the input node 50 voltage is not zero, there is a different current in each input diode. The current is approximately equal to the supply voltage minus the input voltage divided by the resistance value of the series resistor 51, 53. This creates a difference current between the two diodes which is sourced by the op amp 22 output 23. The opto-isolator current source 40, 42 values are proportional to the respective diode current of each source. The difference current at the input node 50 generates a difference current at the output node 60. This output difference current is directed into a high impedance input node 52, modeled as a separate resistor and capacitor, of a unity gain class A/B amplifier 70 generating the output voltage. The class A/B amplifier is high input impedance at this node so the generated difference current can create high output voltages. The class A/B amplifier is cascaded with positive and negative stages to achieve the high voltage at multiple power levels.

In one embodiment transistor output opto-couplers were selected. These parts have diode inputs and NPN bipolar transistor outputs which are inherent current source outputs. The transistor output current is directly proportional to diode current by a gain term called CTR or current transfer ratio.

Figure 2:
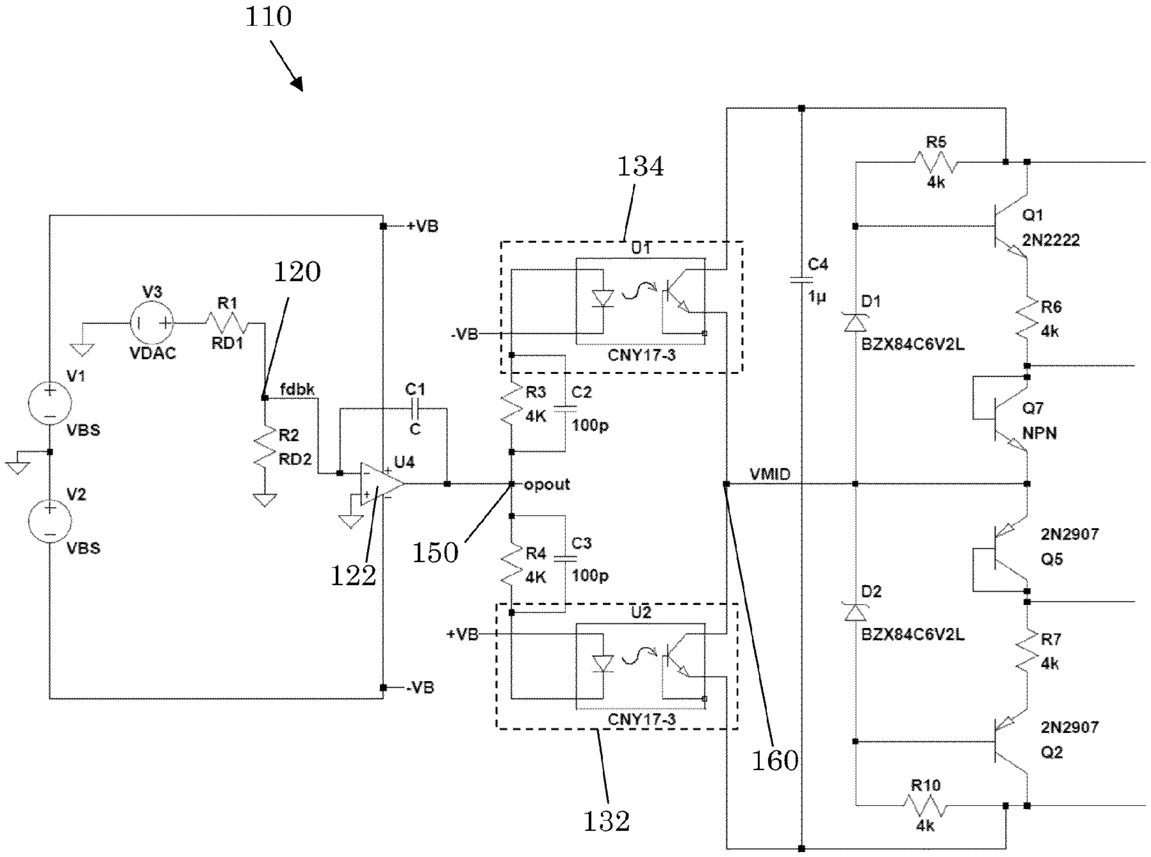
FIG. 2 is a block diagram of a simulation model of a portion of the circuitry shown in FIG. 1.

FIG. 2 is a block diagram of a simulation model 110 of a portion of the circuitry shown in FIG. 1. The circuit was modeled using LTSPICE and available opto-transistor models. As discussed the circuitry includes an input node 120 coupled to an input of an op-amp 122. The output of op-amp 122 is coupled to opto-isolator input node 150. Opto-isolators 132, 134 are modeled with diode inputs and current source outputs based on NPN bipolar transistors. The junction of the two input diodes is the input node 150 and the junction of the two current sources is the output node 160.

Figure 3:
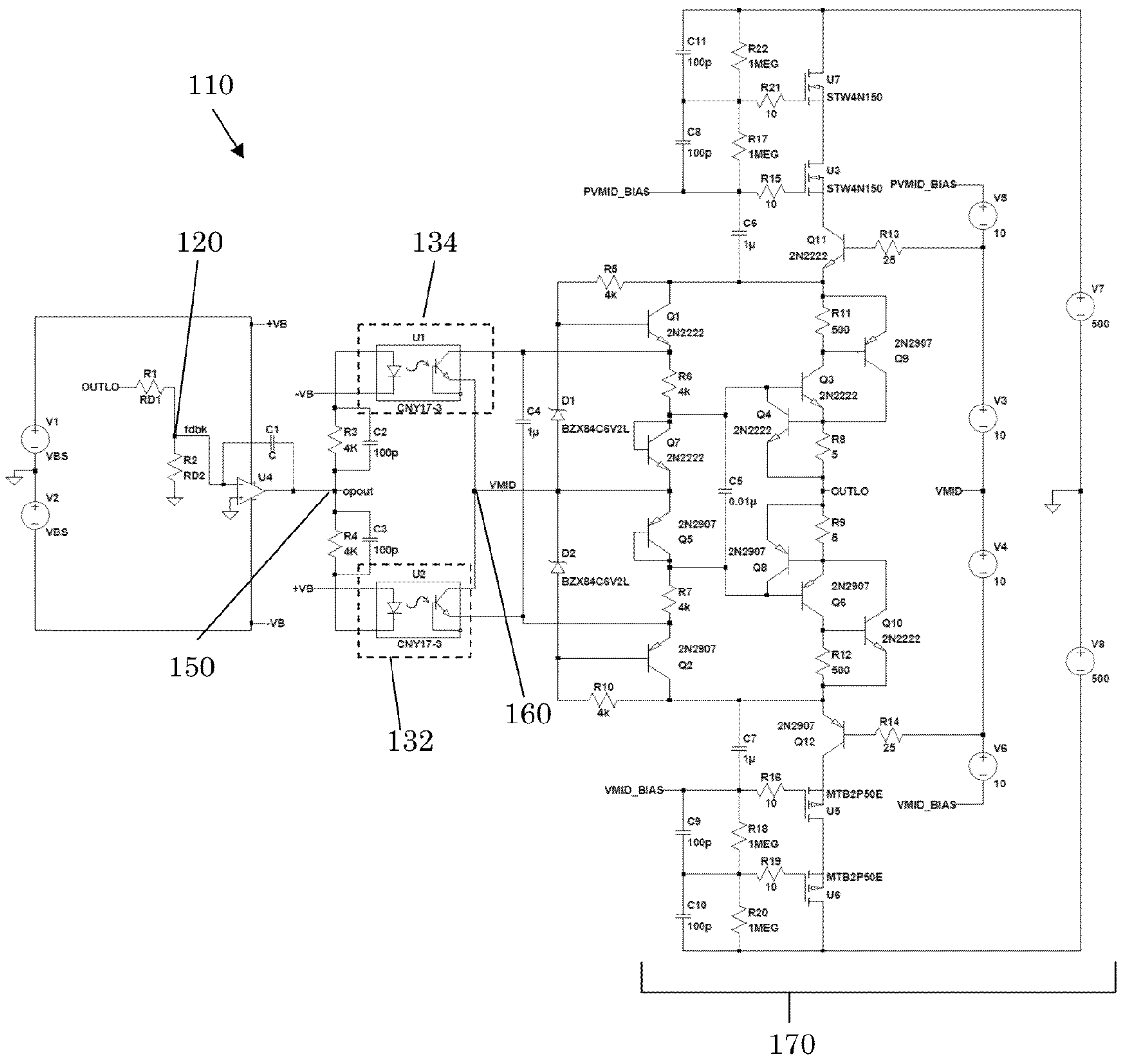
FIG. 3 is a block diagram of a simulation model of a portion of the circuitry shown in FIG. 1 including a high impedance class A/B stage.

A high impedance class A/B stage 170 was added to the model as well in FIG. 3. This model simulated well and showed that this topology could work, generating high gain across the opto isolators. A protoboard of this circuit was design and built.

Several opto-isolators were tested, e.g., the CNY65B available from Vishay (www.Vishay.com) as well as separate opto transmitter SFH757V and receiver SFH250V coupled with plastic optical fiber (all three components from Avago Technology—http://www.avagotech.com). Both configurations worked well. It was verified that CNY65B would work to 10 KV. Accordingly, both configurations are suitable for use with the embodiments disclosed herein including a design having a +/−3000V output.

Figure 4:
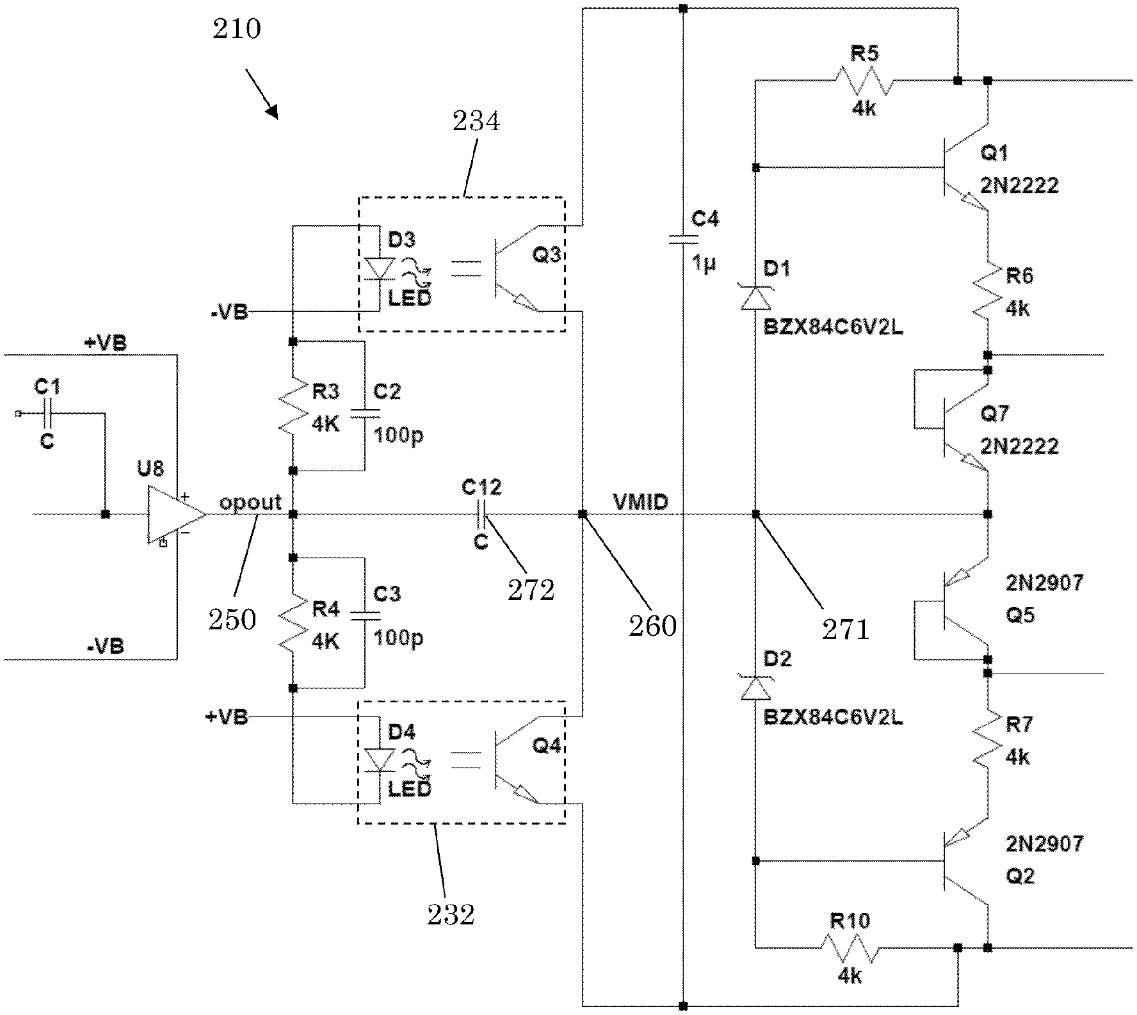
FIG. 4 is block diagram of a dual opto-isolator amplifier embodiment.

FIG. 4 is a block diagram of another embodiment of a dual opto-isolator amplifier 210. A high speed, unity gain buffer U8 is used to drive the input node 250 of the isolated stage. The input node 250 is formed at the junction of 2 current setting resistors, R3 and R4 which are each in parallel with a bandwidth adjustment capacitor, C2 and C3. The opto-isolators 232, 234 are connected in series as discussed above. The junction of the two current sources is the output node 260. In this example, the input diodes of opto-isolators 232, 234 are LED's (transmitters) that each couple to optical fiber that is connected to optical receiver output transistors whose bases are connected to the optical fiber. The output transistors of opto-isolators 232, 234, are connected together at node output node 260 and the difference current flows into node 271, a high impedance input to the class A/B amplifier stage.

The high voltage gain occurs across the isolation barrier in the opto-isolators 232, 234. In one example, the input side, with input diodes U5, U6 is driven by voltage with maximums of +/−15V. The output node 260 can be much higher voltages, e.g., +/−3000V. This is a unique aspect of the design. The way the class A/B stage is biased with cascade circuits to enable high voltage and different power levels may be the same as used in other Keithley SMUs such as the model 2400 and 237.

Studying the frequency response of the isolated gain stage, from input node 250 to the output node 260, two poles were measured in the roll off of the high gain. To cancel one pole in the isolated gain stage, which increases the bandwidth and creates a desired single pole system, the capacitors C2 and C3 were added to create a zero in the response.

Figure 5:
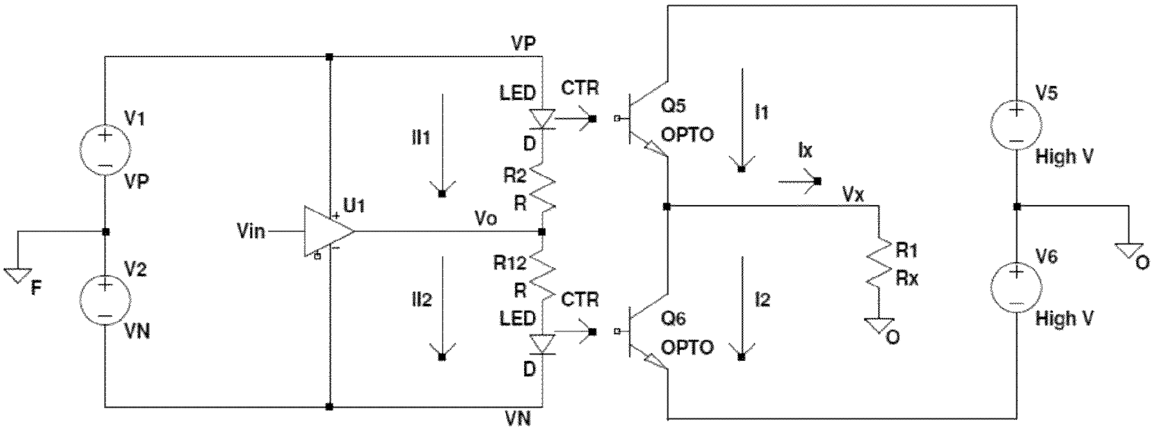
FIG. 5 shows a simplified schematic for gain calculation purposes.

FIG. 5 shows a simplified schematic for gain calculation purposes. The gain for this portion of the circuit may be calculated as follows:

$$Vx=Ix*Rx$$

$$Ix:I1-I2$$

$$I1=CTR*II1,$$

where CTR is the current transfer ratio of the opto-isolator $$I2=CTR*112$$

where CTR is the current transfer ratio of the opto-isolator $$II1=(VP-VD-Vo)/R,$$

where VD is voltage across the diode $$II2=(Vo-VD-VN)/R,$$

where VD is voltage across the diode $$Ix=CTR/R*((VP-VD-Vo)-(Vo-VD-VN))$$

$$Ix=CTR/R*(VP-2*Vo+VN)$$

Since $$VP=-VN; VP+VN=0$$

and:

$$Ix=-CTR/R*2*Vo$$

$$Vx=Ix*Rx$$

$$Vx=-2*CTR*Rx/R*Vo$$

$$Vo=Vin$$

$$Vx/Vin=-2*CTR*Rx/R$$

It is readily apparent from the calculations above that the difference current generated by the series opto-isolator current source outputs is directed at the high impedance node of the amplification stage which creates gain.

Figure 6:
FIG. 6 is a graph showing the compensated response of a dual opto-isolator amplifier.
Figure 7:
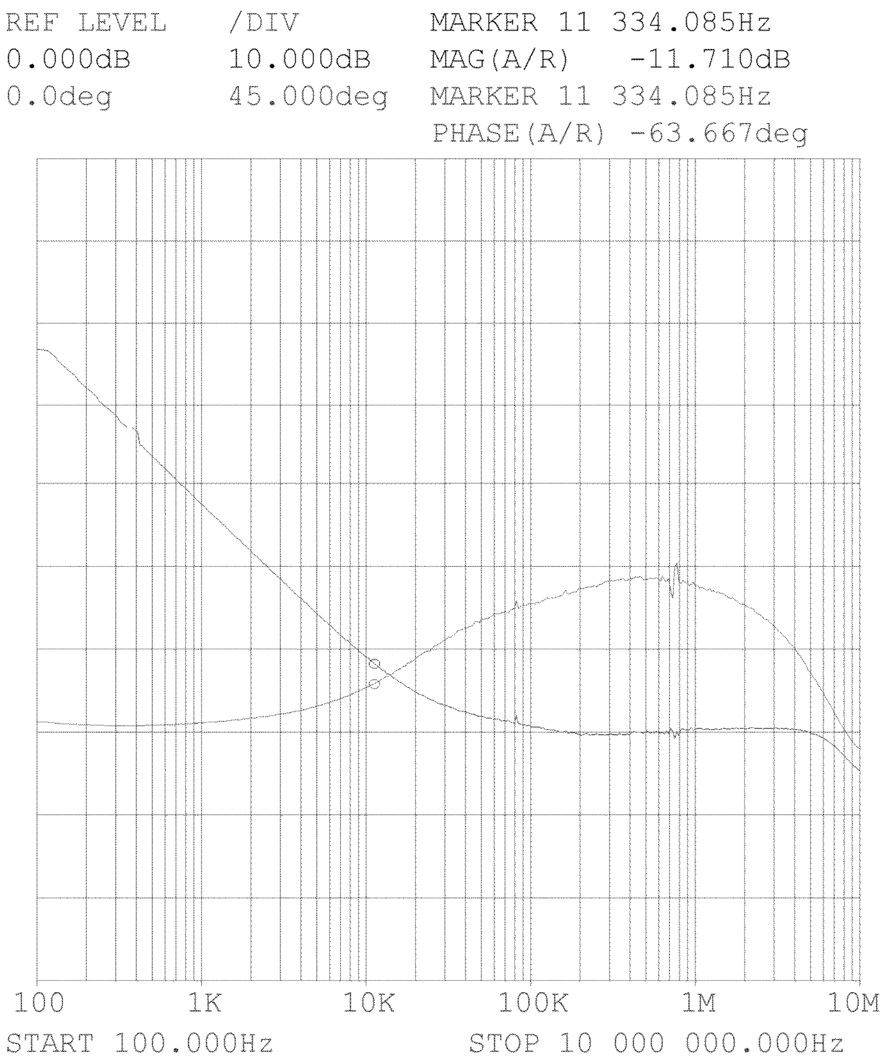
FIG. 7 is a graph showing the response of a dual opto-isolator amplifier including a feed forward capacitor.

The compensated response is shown in FIG. 6. In the current application, it is desired that the gain flatten out to a gain of 1 (or zero dB). A 4700 pF feed-forward capacitor 272 may be added from input node 250 to output node 260 to flatten the gain out to zero dB at high frequencies as shown in FIG. 7.

Figure 8:
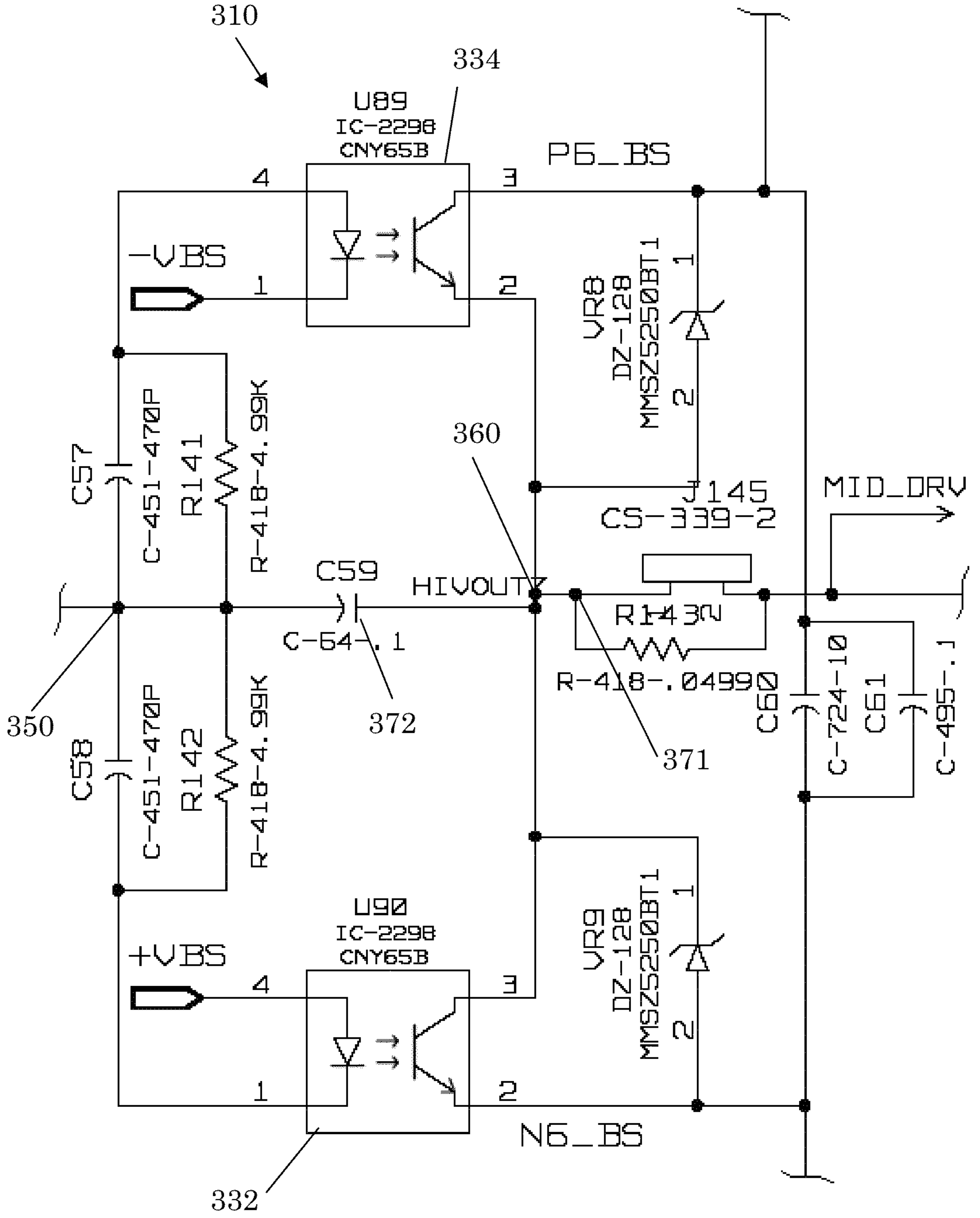
FIG. 8 is a block diagram of a dual opto-isolator amplifier embodiment.

FIG. 8 is a block diagram of a dual opto-isolator amplifier embodiment 310. In this embodiment, Vishay CNY65B opto-isolators 332, 334 were used between input node 350 and output node 360. A 4700 pF feed-forward capacitor 372 may be added from input node 250 to output node 260 to flatten the gain out to zero dB at high frequencies as discussed above.

Figure 9:
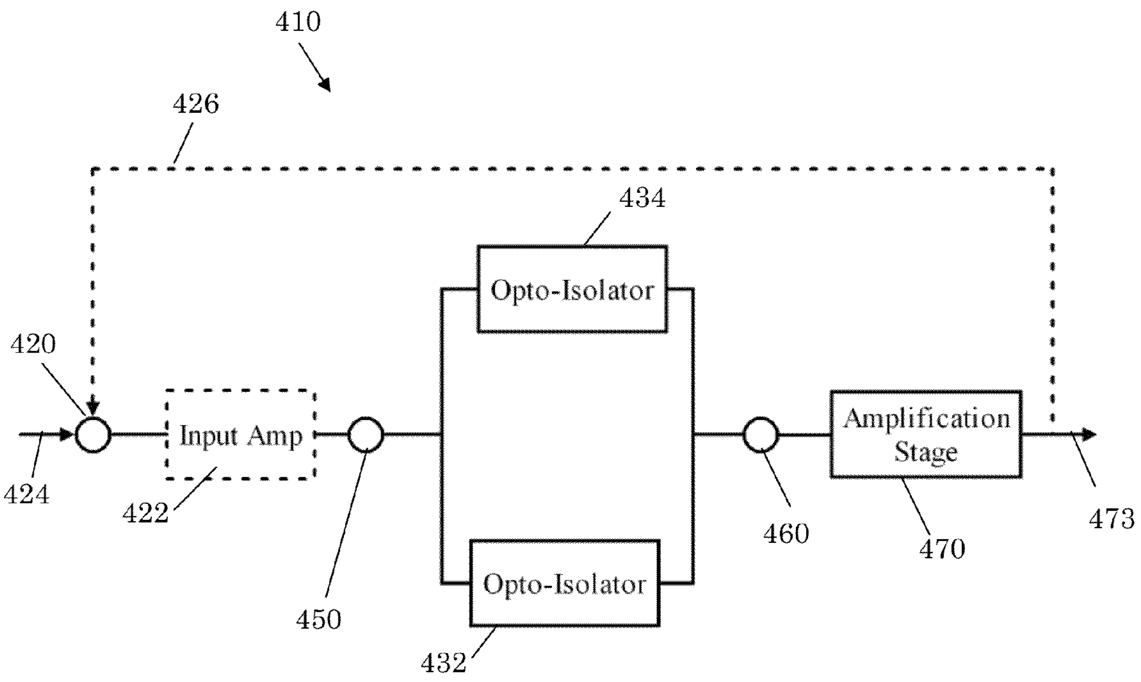
FIG. 9 is a general block diagram of a dual opto-isolator amplifier.

FIG. 9 is a general block diagram of a dual opto-isolator amplifier 410. The amplifier includes an input node 420 configured to receive an input signal to be amplified as shown by reference number 424. A feedback input may also be provided as shown generally by dashed line 426. The amplifier may include an input amplifier 422 configured to drive an input node 450. The amplifier includes dual opto-isolators 432, 434 coupled between the input node 450 and the output node 460. The output node is coupled to an amplification stage 470 configured with an output 473. The input signal may be limited to +/−15V. To achieve the large voltage gain with a minimum number of parts, gain is created across an opto-isolated barrier formed by dual opto-isolators 432, 434.

It should be understood that many variations are possible based on the disclosure herein. Although features and elements are described above in particular combinations, each feature or element can be used alone without the other features and elements or in various combinations with or without other features and elements.

What is claimed is:

1. An opto-isolated amplifier comprising:

an input node configured to receive an input to be amplified;

a pair of opto-isolators coupled between an input node and an output node;

the opto-isolators being configured to create gain between the input node and the output node; and an amplification stage having an input coupled to the output node and an output configured to generate an amplified output wherein each opto-isolator has an output and the opto-isolator outputs are configured to generate a difference current that is directed into the input of the amplification stage.

2. The amplifier of claim 1, further comprising an input amplifier configured to receive the input to be amplified and having an output coupled to the input node.

3. An opto-isolated amplifier comprising:

an input node configured to receive an input to be amplified;

a pair of opto-isolators coupled between an input node and an output node;

the opto-isolators being configured to create gain between the input node and the output node; and an amplification stage having an input coupled to the output node and an output configured to generate an amplified output;

wherein each opto-isolator has an input diode that conducts an input diode current based on the input voltage, the input diodes being configured in a series configuration joined at the input node, wherein the input voltage sets a difference current between the two input diodes.

4. The amplifier of claim 3, wherein each opto-isolator has an output configured as a current source and having a current that is a gained value based on the corresponding input diode current.

5. The amplifier of claim 3, wherein the input diodes are coupled to the input node via current setting resistors.

6. The amplifier of claim 3, wherein each opto-isolator has an output and the opto-isolator outputs are configured to generate a difference current that is directed into the input of the amplification stage.

7. The amplifier of claim 1, wherein the amplification stage is a unity gain amplifier.

8. The amplifier of claim 1, wherein the amplification stage includes a class A/B amplifier.

9. The amplifier of claim 1, wherein the input of the amplification stage has a high impedance compared to an impedance at the output node.

10. An opto-isolated amplifier comprising:

an input node configured to receive an input to be amplified;

a pair of opto-isolators coupled between an input node and an output node;

the opto-isolators being configured to create gain between the input node and the output node; and an amplification stage having an input coupled to the output node and an output configured to generate an amplified output;

wherein each opto-isolator has an output and the opto-isolator outputs are configured to generate a difference current and wherein the input of the amplification stage has a high impedance compared to an impedance at the output node, the difference current being directed at the high input impedance input of the amplification stage to generate a gained voltage.

11. The amplifier of claim 1, further comprising a feed forward capacitor coupled between the input node and the output node.

12. An opto-isolated amplification method comprising:

receiving an input to be amplified at an input node;

providing a pair of opto-isolators coupled between and input node and an output node;

the opto-isolators being configured to generate gain between the input node and the output node; and providing an amplification stage having an input coupled to the output node and an output configured to generate an amplified output;

wherein each opto-isolator has an output and the opto-isolator outputs are configured to generate a difference current that is directed into the input of the amplification stage.

13. The method of claim 12, further comprising providing an input amplifier configured to receive the input to be amplified and having an output coupled to the input node.

14. An opto-isolated amplification method comprising:

receiving an input to be amplified at an input node;

providing a pair of opto-isolators coupled between and input node and an output node;

the opto-isolators being configured to generate gain between the input node and the output node; and providing an amplification stage having an input coupled to the output node and an output configured to generate an amplified output;

wherein each opto-isolator has an input diode that conducts an input diode current based on the input voltage, the input diodes being configured in a series configuration joined at the input node, wherein the input voltage sets a difference current between the two input diodes.

15. The method of claim 14, wherein each opto-isolator has an output configured as a current source and having a current that is a gained value based on the corresponding input diode current.

16. The method of claim 14, wherein the input diodes are coupled to the input node via current setting resistors.

17. The method of claim 14, wherein each opto-isolator has an output and the opto-isolator outputs are configured to generate a difference current that is directed into the input of the amplification stage.

18. The method of claim 12, wherein the amplification stage is a unity gain amplifier.

19. The method of claim 12, wherein the amplification stage includes a class A/B amplifier.

20. The method of claim 12, wherein the input of the amplification stage has a high impedance compared to an impedance at the output node.

21. An opto-isolated amplification method comprising:

receiving an input to be amplified at an input node;

providing a pair of onto-isolators coupled between and input node and an output node;

the opto-isolators being configured to generate gain between the input node and the output node; and providing an amplification stage having an input coupled to the output node and an output configured to generate an amplified output;

wherein each opto-isolator has an output and the opto-isolator outputs are configured to generate a difference current and the wherein the input of the amplification stage has a high impedance compared to an impedance at the output node, the difference current being directed at the high input impedance input of the amplification stage to generate a gained voltage.

22. The amplifier of claim 14, further comprising coupling a feed forward capacitor between the input node and the output node.

* * * * *